INVENTOR
Thomas Coe
Cornelis M. van de Kerkhof
BY
Frank R. Jifani
AGENT

INVENTOR
THOMAS COE
CORNELIS M. VAN DE KERKHOF
BY
Frank R. Trifari
AGENT

United States Patent Office 3,261,769

Patented July 19, 1966

3,261,769
METHOD OF FORMING METALLIC LINERS BY ELECTRODEPOSITION IN APERTURED PRINTED CIRCUIT BOARDS

Thomas Coe and Cornelis Marinus van de Kerkhof, Emmasingel, Eindhoven, Netherlands, assignors to North American Philips Company, Inc., New York, N.Y., a corporation of Delaware Filed Aug. 31, 1962, Ser. No. 220,672
Claims priority, application Netherlands, Sept. 5, 1961, 268,976
2 Claims. (Cl. 204—15)

This invention relates to an improved method of producing printed circuit boards having metallised apertures.

A method is known which has for its object to provide the metallized apertures in printed circuit boards for mounting electrical and electronic parts or for establishing an electric connection between printed wirings on either side of the boards with the metallized conductive layer in the aperture which permits soldering, if desired.

This known method comprises the following steps.

The required apertures are punched in the board or panel having the printed wiring. The printed wiring is subsequently covered with a self-supporting mask for example of rubber having apertures corresponding accurately, according to place and size, with the apertures of the printed-wiring panel. The mask and the walls of the apertures are coated with a thin, conductive layer, for example a lacquer containing a silver powder. By electro-deposition a layer of a metal, for example copper is coated on the walls of the apertures and on the mask. After removal of the mask a panel with printed wiring and metallized apertures is obtained.

This method has a number of disadvantages and drawbacks.

The quantity of metal deposited on the mask is considerably larger than the quantity of metal deposited in the apertures. This loss of material is still further enlarged by the fact that, as compared with the desired thickness of the metal layer on the walls of the apertures, the layer deposited on the mask is 50% greater in thickness. This is due to the difference in the rates of deposition on the mask compared to the walls of apertures, caused by the local differences in current density on the object.

A further drawback of the known method is that after each electrolysis the mask must be cleaned for a succeeding use.

The method according to the invention obviates the enumerated disadvantages, while additional advantages are obtained.

In accordance with the invention a circuit board is punched and the apertures are provided internally with a thin, conductive layer, as is known. A mask of a non-conductive material which is coated on one side with a conductive layer is placed over the circuit board. The mask will have apertures corresponding with those on the printed circuit board. This mask is clamped to the circuit board with is conductive side on the wiring and forming an interface between the mask and board. An electro-deposited coating is then applied only on the walls of the aperture and over the thickness only of the conductive layer on the mask.

This method has the advantage that during electro-deposition metal is only applied on the walls of the apertures and the places where the conductive coating on the mask is exposed. This means a considerable economy in material as well as electric energy. Also mask can be used again immediately without, or with a minimum of, cleaning. The method according to the invention is, moreover, readily adapted to mass production mechanization or automation.

In a preferred embodiment of the method use is made of a mask in which apertures are punched, which have a larger diameter than the apertures of the printed-wiring panel. With the electro-deposition of the metal layer on the walls of the apertures a metal layer is also formed, when use is made of such a mask, on the conductor round about the place of the aperture, said metal layer being in contact with the metal layer on the walls of the apertures. It is thus ensured that the metal layer formed on the walls of the apertures establishes a satisfactory electric and mechanical connection to the printed wiring.

The method according to the invention will be described more fully with reference to the accompanying drawing.

The printed wiring 1 is applied to a non-conductive support 2, for example of hard paper, by a known suitable method, in which a metal layer (the wiring 1) is deposited in the desired pattern on the support.

Figures 1, 2, 3, 4, 5, 6:
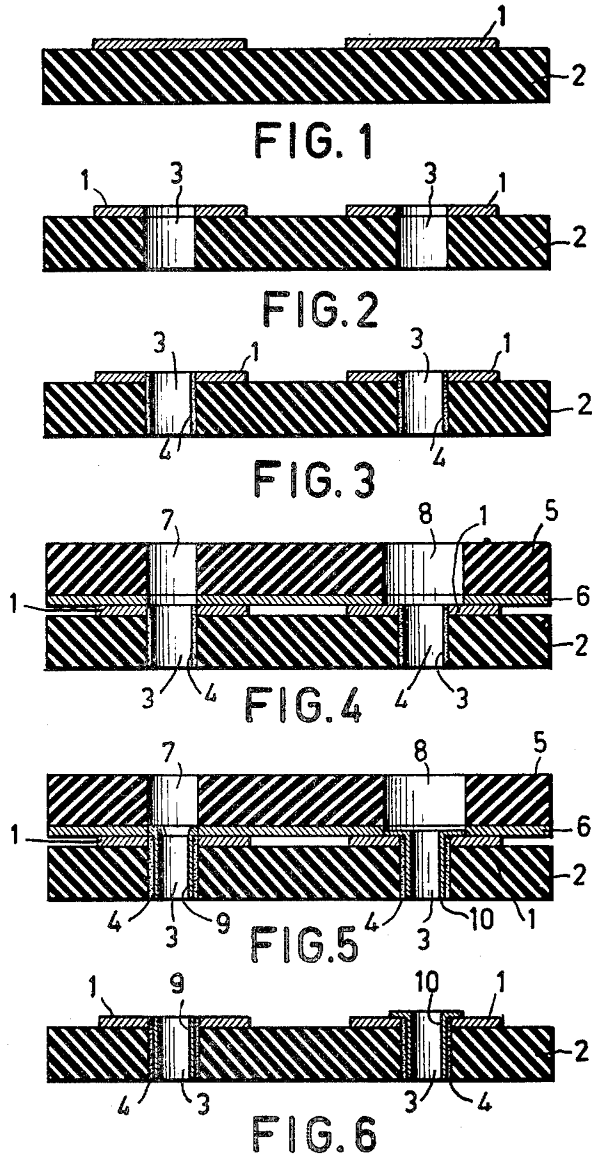
FIG. 1 is a cross sectional view of a panel without apertures having a printed wiring.
FIG. 2 shows the same sectional view after the apertures have been punched out.
FIG. 3 is the sectional view of FIG. 2, the walls of the apertures being coated with a thin layer of conductive material.
FIG. 4 is the same sectional view as FIG. 3, covered with a mask.
FIG. 5 is the sectional view after the metal layer has been electro-deposited.
FIG. 6 shows the completed board after the mask has been removed.

In the panel having the printed wiring (FIG. 1) the apertures 3 are punched (FIG. 2). Then the walls of the apertures are coated with a thin electrically conductive layer 4 (FIG. 3) according to the practice in the electroplating art. To this end use may be made of a suspension of a metal powder, for example copper powder or silver powder in a solution of an organic binder, for example nitrocellulose, polyvinylbutyral or the like in a volatile solvent. It is also possible to use for this purpose a graphite suspension or to deposit a metal layer catalytically. When a metal lacquer bath is used, the panel is inserted in the bath with its rear side to the lacquer surface, and pushed down into the bath until the lacquer surface is co-planar to the panel surface on the side of the printed wiring. It is furthermore possible to stack a plurality of apertured panels on top of one another and in a suitable manner cause the lacquer to flow into the apertures. The last-mentioned method is used particularly with panels having printed wiring on both sides.

After redundant lacquer, if any, is removed from the apertures and also the rear side of the panel is cleaned, a mask 5, coated with a conductive layer 6 is clamped to the support 2 with the conductive coated side in contact with the printed wiring 1. To this end use may be made of clamping screws and claws of non-conductive material (not shown). The mask 5 may be made from the same material as the board 2 for the printed wiring 1.

In the coated mask (5, 6) the apertures 7 and 8 are punched, the aperture 7 having the same diameter as the corresponding aperture 3 in the printed wiring panel. The aperture 8 in the mask (5, 6) has a diameter exceeding that of the corresponding aperture 3 in the printed wiring panel. Particularly satisfactory results are obtained when the diameter of the aperture in the mask is at least about 1 mm. larger than the diameter of the corresponding aperture in the printed wiring panel. After electro-deposition of metal in the aperture, a layer 10 having a horizontal flange is obtained, which is rigidly connected electrically and mechanically to the printed wiring (see FIG. 5).

FIG. 6 is a sectional view of the finished panel. The metal layer 9 is in contact with the wiring 1 only over a thickness equal to the thickness of the printed wiring and/or the thickness of coating 6 on the mask. The wiring usually has a thickness of a few tens of microns, for example 30 to 40/$\mu$ A wire soldered in the aperture (3, 9) cannot withstand as high a tensile force, at right angles to the panel, as a wire soldered in the aperture (3, 10), since the aperture layer 10 is also deposited on the printed wiring 1.

Figure 7:
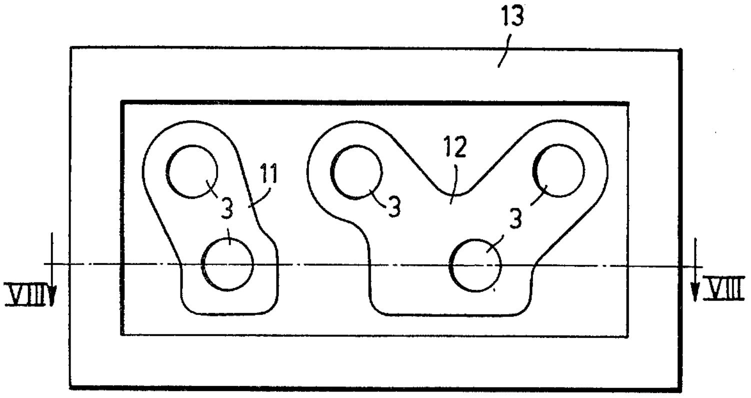
FIG. 7 is a plan view of a printed-wiring panel.
Figure 8:
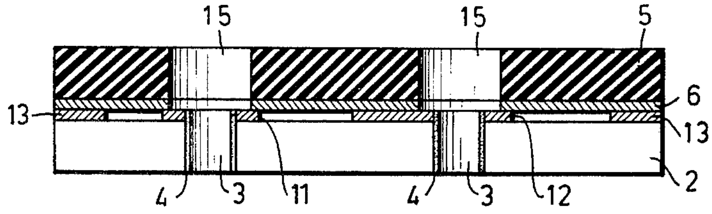
FIG. 8 is a cross sectional view taken on the line VIII—VIII in FIG. 7, with a mask covering.

In order to avoid undesired deposition during the electrolysis between the circuit panel (1, 2) and the mask (5, 6), a printed-wiring panel (or a mask) may be used, in a further embodiment of the invention, in which the printed wiring 11, 12 proper is surrounded by a closed metal strip 13 (or the mask 5 has a closed strip 13) having the thickness of the wiring 12 (see FIG. 7), obtained in the same manner as the wiring itself. As shown in FIG. 8 the printed-wiring panel (2, 11, 12, 13) provides the sectional view on the line VIII—VIII in FIG. 7. After the coated mask 5, 6 with the apertures 15 is applied, the bath liquid (electrolyte) is prevented from penetrating between the support 2 of the printed wiring and the metal layer 6.

Figure 9:
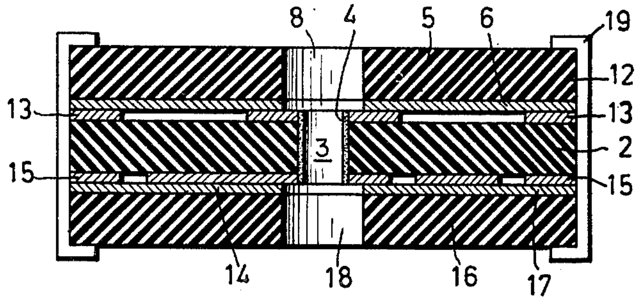
FIG. 9 is a cross sectional view of a panel having printed wiring on either side, a mask being clamped to both sides.

FIG. 9 shows, in a cross sectional view, how the method according to the invention can be carried out with a board having printed wiring on each side. Two masks (5, 6 and 16, 17) are clamped to the support 2 having the printed wirings 13 and 15 and having the aperture 3 with a lacquer layer 4 on the walls thereof, each mask consisting of a support 5 and 16 respectively and a coated layer 6 and 17 respectively, the apertures 8 and 18 respectively being punched therein. The assembly is clamped together for example by clamps 19, preferably of a non-conductive material. The assembly is suspended in a solution of a metal salt, after which electrolytically a metal layer is used as a cathode.

A suitable electro-deposition bath may consist, for example, of 250 gms. of $CuSO_4.5H_2O$ and 60 mls. of $H_2SO_4$ in a quantity of water such that one litre of the solution is obtained. A suitable current density is about 6 A./dm.$^2$ Within about 30 minutes a copper layer of about 30$\mu$ in thickness is deposited on the walls of the apertures.

What is claimed is:

1. A method of forming metallic liners by electrodeposition in apertured printed circuit boards comprising coating the aperture surface of the circuit board with a conductive coating material, coating a surface of a masking board with a conductive coating material, punching apertures through said masking board so that the apertures of the circuit board and the apertures of the masking board are coaxially aligned when the masking board is juxtaposed over the circuit wiring on the circuit board, securing the circuit and masking boards in the relation above set forth and emersing the assembly thus obtained in an electrolytic bath with said conductive coating material being the cathode thereof.

2. The method according to claim 1 wherein the apertures in said masking board are formed having a larger diameter than the diameter of the apertures in the circuit board.

References Cited by the Examiner

UNITED STATES PATENTS 3,071,521 1/1963 Ehrhart ------------ 204—224

FOREIGN PATENTS 598,722 5/1960 Canada.
840,544 7/1960 Great Britain.

JOHN H. MACK, *Primary Examiner.*

R. GOOCH, *Examiner.*

T. TUFARIELLO, *Assistant Examiner.*